United States Patent
Gessner et al.

(10) Patent No.: US 6,656,527 B1
(45) Date of Patent: Dec. 2, 2003

(54) METHOD AND DEVICE FOR PRODUCING AEROGELS

(76) Inventors: Thomas Gessner, Salzstrasse 111, D-09113 Chemnitz (DE); E. Stefan Schulz, Rösslerstrasse 18A, DE-09120 Chemnitz (DE); Thoralf Winkler, Hakenfelder Strasse 8b, D-13587 Berlin (DE)

(*) Notice: Subject to any disclaimer, the term of this patent is extended or adjusted under 35 U.S.C. 154(b) by 0 days.

(21) Appl. No.: 09/762,003
(22) PCT Filed: Jul. 30, 1999
(86) PCT No.: PCT/EP99/05538
§ 371 (c)(1),
(2), (4) Date: Jul. 3, 2002
(87) PCT Pub. No.: WO00/06491
PCT Pub. Date: Feb. 10, 2000

(30) Foreign Application Priority Data

Jul. 30, 1998 (DE) .......................................... 198 34 265

(51) Int. Cl.[7] .......................... B05D 3/02; C01B 33/158; H01L 21/316
(52) U.S. Cl. ....................................... 427/246; 427/387
(58) Field of Search ................................ 427/243, 244, 427/245, 246, 247, 327

(56) References Cited

PUBLICATIONS

Pajonk, Journal of Physique, Colloque, C4–13/C4–22, 1989.*

Hyun et al, Yoop Hakhoechi, 36(3), pp 307–318, 1999.*

* cited by examiner

Primary Examiner—Erma Cameron
(74) Attorney, Agent, or Firm—Blakely, Sokoloff, Taylor & Zafman

(57) ABSTRACT

A method of producing an aerogel layer on a substrate is described. A precursor mixture is provided by mixing at least one material selected from the group consisting of silicates, metal alcolates, aluminates and borates with a solvent. The precursor mixture is used to form a lyosol. The precursor mixture or the lyosol formed therefrom is then applied to the substrate wherein a layer of the lyosol is formed on the substrate. A gel is formed from the lyosol by chemical conversion at a temperature at which the solvent is present in a liquid state. At a pressure between 0.5–2.0 torr the ambient temperature is reduced by about 3–70k below the point at which the solvent is converted into a solid state. The solvent is then converted into a gaseous state in a drying chamber while reducing the pressure of the solvent below the triple point and removing solvent from the gel layer.

25 Claims, 5 Drawing Sheets

METHOD AND DEVICE FOR PRODUCING AEROGELS

The invention relates to a method and for producing an aerogel on a substrate. Aerogels are highly porous materials comprising silicon or metal oxides, which are characterised by particularly low densities of 70–300 Kg/m$^3$ at extremely high internal surface areas of up to 1000 m$^2$/g (see DE 3924244 A1). They are produced from a lyogel, which is produced in a sol-gel process from a lyosol. Gels are shape-stable disperse systems comprising at least two components, generally a solid, colloidally distributed material with long or heavily branched particles and a dispersant. If the dispersant between the particles is a liquid, a lyogel is present. If the liquid of the lyogel is replaced by air as the dispersant, an aerogel is produced.

A known method for producing a SiO$_2$ aerogel is described S. S. *Kistler in J. Phys. Chem.* 36 (1932), pages 52–64. Water glass is used therein as the precursor and acid (HCl; H$_2$SO$_4$). A hydrogel is formed in which the water is subsequently substituted by ethanol or methanol. The alcohol-containing gel which is produced is then subjected in an autoclave to a pressure of more than 71 bar and a temperature of >100° C. The solvent is in a state above the critical point at which there is no more surface tension. The solvent can escape from the gel without shrinking of the gel occurring by reason of the surface tension. The escaping solvent is drawn off so that drying of the gel occurs. An aerogel is produced. Of disadvantage with this so-called supercritical drying in an autoclave are the high pressures and temperatures which result in an expensive method. Methods are also known in which the alcohol is replaced by carbon dioxide, which permits supercritical drying at low temperatures. Furthermore, two further methods are mentioned in International Patent Publication WO92/926213 A1. A first method mentioned therein is freeze drying. An alcogel (ie. a lyogel with alcohol as the dispersant) is frozen so that a solid gel is produced. The solvent is subsequently removed under reduced pressure by sublimation. The publication refers to no solvent suitable for this purpose and, furthermore, condemns this method due to a disadvantageous volumetric increase during crystallisation or during freezing. Furthermore, the publication is concerned with a method for directly vaporising the solvent from the liquid phase into the gas phase. The negative influences of the surface tension are to be minimised by a suitable solvent mixture and conduct of the method.

A method is also disclosed in publication WO95/17347 A1 which, for the purpose of avoiding the disadvantages of the supercritical drying, proposes a sub-critical vaporisation at increased or reduced pressure with respect to normal pressure or at ambient pressure. The disadvantageous effect of the surface tension of the vaporising liquid is reduced in this case also by a suitable conduct of the method and/or suitable solvents, which exhibit a low surface tension. Although the publication names a large number of possible solvents on an inclusive basis, only embodiments with the solvent isoproponol, optionally with the addition of methanol, are described in more detail.

A method of producing aerogels, which is also supposed to find application in the field of microelectronics, is disclosed in EP 0775669 A2. A precursor comprising tetraerthoxysilane (TEOS) water and multisolvent (a solvent mixture comprising a polyol and ethanol) is used. After deposition of the gel by spinning it onto a semi-conductor wafer, the ethanol is vaporised. After addition of a catalyst from the gas phase, gelling occurs, whereby a wet SiO$_2$ network is produced, the gel is then dried by vaporisation of the polyol. As a result of a reaction between the polyol and TEOS, the storage and transport time of the precursor is heavily limited. The addition of the catalyst from the gas phase results in a vertical diffusion gradient in the aerogel layer, whereby inhomogeneous layer properties can occur in the vertical direction.

It is an object of the invention to produce an aerogel layer with homogeneous properties in a simple and economical manner.

This and other objects of the present invention are therein solved by a method of producing an aerogel layer on a substrate, said method comprising the steps of: a) providing a precursor mixture by mixing at least one material from a group including silicates, metal alcoholates, aluminates and borates with a solvent, said precursor mixture for forming a lyosol; b) applying the precursor mixture or a lyosol formed therefrom to said substrate, wherein a layer of the lyasol is formed on said substrate; c) forming a gel from the lyosol, a temperature being selected at which the solvent is present in a liquid state; d) reducing, at a pressure of between 0.5 and 2 bar, the temperature by about 3–70K below the point at which the solvent is converted into the solid state; and e) converting the solvent into the gaseous state in a drying chamber whilst reducing the pressure of the solvent below the triple point and removing the solvent from the gel layer.

In the method in accordance with the invention for producing an aerogel layer on a substrate, a precursor is firstly prepared by mixing at least one material from a group including silicates, metal alcoholates, aluminates and borates with a solvent to form a lyosol mixture. Silicates include the salts and esters of orthosilicic acid and their condensation products, that is to say for instance, the silicic acids and the silicon alcoholates (also referred to as silicon alcoxides or alcoxysilanes). A lyosol is a colloidal solution in which a solid or liquid substance is dispersed in a liquid medium. The addition of water can possible be necessary to form the lyosol. The lyosol is not produced directly on mixing the material with the solvent but only after an initial chemical conversion (e.g. hydrolysis and polycondensation).

The precursor mixture or the lyosol formed therefrom is then applied to the substrate. As a result of further chemical conversion (hydrolysis and polycondensation), a gel is formed from the lyosol, whereby a temperature is selected at which the solvent is present in a liquid state. The pressure is preferably so selected that it is between 0.5 and 2 bar where the range is include, ambient pressure and a slightly reduced pressure. The pressure range may be adjusted relatively easily from the process engineering point of view. The temperature is so selected that the solvent is present in a liquid state in order to promote the formation of a gel.

After the has been formed (whereby small accounts of the starting materials and products of the reactions can remain in the gel), the temperature is reduced, at a pressure between 0.5 and 2 bar, by about 2–70K, preferably 5–15K, below the point at which the solvent changes into the solid state (solidifies). The only slight reduction of temperature below the solidification point results, on the one hand, in a saving of energy and an acceleration of the method and, on the other hand, in low mechanical stresses in the gel layer induced by the temperature and solidification.

The solvent is then converted into the gaseous state in the drying chamber whilst reducing the pressure of the solvent to below the triple point and removed from the gel layer. The gaseous solvent is conducted out of the drying chamber. When reducing the pressure, the temperature can be maintained constant or increased. Of importance is merely that the change of state from the solid into the gaseous state occurs without passing through the liquid state, ie. below the triple point.

Preferably a solvent is used which has a triple point at temperature above 0° C., preferably above 15° C. This permits a considerable simplification of the apparatus since cooling water can be used for cooling purposes.

In an advantageous embodiment of the method in accordance with the invention, a low-molecular tertiary alcohol is used as the solvent. Low-molecular tertiary alcohols, particular t-butanol, have, on the one hand, a triple point at a relatively high temperature. On the other hand, tertiary alcohols are less reactive and have a smaller tendency to alcoholysis. They thus have a better compatibility with a large proportion of the group of materials including the silicates, which results in better transportability and storage ability of the precursor mixture. Furthermore, their evaporation properties permit rapid sublimation.

In a preferred embodiment of the method in accordance with the invention a precursor is prepared by mixing a material predominantly comprising an alcoxysilane with a low-molecular tertiary alcohol, constituting the solvent, and with water. An aerogel substantially comprising silicon oxide is formed from such a precursor. In addition to the predominant proportion of the alcoxysilane, the mixture can include, for instance, a small proportion of a metal alcoholate or borate in order to modify the silicon oxide structure. The addition of water serves to hydrolyse the alcoxysilane, whereby the products which are produced cross-link by polycondensation. Although water is formed again during the latter, a larger amount is consumed during the hydrolysis.

Tetraethoxysilane (TEOS) is preferably used. T-butanol is preferably used as the low-molecular tertiary alcohol. Tetraethoxysilane is an economic starting material, which is frequently used within semi-conductor technology and which furthermore, is not so toxic as eg. tetramethoxysilane (TMOS). It has transpired that the combination of tetraethoxysilane with t-butanol results in a precursor with an excellent storage ability and outstanding processing qualities, associated with which, amongst other things, is a relatively small health risk. The combination of materials also has a good miscibility with water, which is required as a reaction partner for the hydrolysis of the tetraethoxysilane.

The water, which is mixed into the precursor in addition to the solvent in the preferred embodiment, acts principally as a reaction partner for the hydrolysis as a prerequisite for the sol-gel method. The precursor is preferably prepared by firstly mixing a material from the group of materials referred to above with the solvent, whereby the solvent (possibly solid at room temperature) is liquefied by heating before the mixing. The water is then mixed in. A catalyst is preferably added to accelerate the gel formation. Both multi-stage catalysis methods, in which, initially, a first catalyst (eg. NH$_4$OH) which promotes the hydrolysis and, subsequently a second catalysis (eg. HCl), which promotes the condensation are added and the addition of only one catalyst (eg. HF), which accelerates both reactions, are possible. The use of a catalyst, which is preferably added in an aqueous solution, accelerates The method and thus increases its efficiency.

A preferred embodiment of the method in accordance with the invention is characterised in that a pre-gelling occurs before the application of the lyosol to the substrate. This increases the viscosity of the substance so that relatively thick layers of the gel can be produced with simple, conventional application methods, for instance, by spinning.

In a preferred embodiment of the method in accordance with the invention, the gel layer formed on the substrate is washed with the solvent before the reduction in the temperature to solidify the solvent. This serves to enrich the solvent in the gel layer and, at the sane time, to remove excess starting materials of the hydrolysis and condensation reactions. A hydrophobic agent can advantageously be added at the same time to the washing process, which replaces OH groups curd water in the gel layer by alkyl groups (eg. hexamethyldisilazane or trimethylchlorosilane).

A preferred embodiment of the method in accordance with the invention is characterised in that a precursor is prepared by mixing tetraethoxysilane with more than twice the amount (moles) of t-butanol, preferably with 4 to 30 times the amount of t-butanol, at a temperature at which the mixture is present in liquid form and water is added in an amount which corresponds to 4 to 30 times, preferably about 6 to 10 times the amount of the tetraethoxysilane. A catalyst which accelerates hydrolysis and/or condensation is then added. Before application to the substrate, the mixture is then stored at a temperature at which the mixture reimains liquid and under an atmosphere saturated with t-butanol. The pre-gellification takes place which increases the viscosity. Depending on the choice of catalyst, the mixture is preferably stored for a period between 1 hour and a number of days. Catalysts are also possible which permit a shorter time. The pre-gelled mixture is then applied to the substrate by spinning and caused to solidify by reducing the temperature. These steps preferably occur at pressures between 0.5 and 1 bar. The t-butanol is finally converted to a gaseous state below the triple point by reducing the pressure to below 0.05 bar and is, thus, removed from the gel layer. The gaseous t-butanol is conducted out of the drying chamber. After the drying process, the aerogel layer applied to the substrate is post-treated at a temperature between 200° C. and 800° C. in an inert gas atmosphere or a reduced pressure air atmosphere. Both the residue of the water and also residues of undesired excess starting materials are, thus, removed. A treatment with a hydrophobia-imparting agent (e.g. hexamethyldisilazane or trimethylcliorosilane) is then preferably performed in order to replace remaining OH groups (or water) with methyl or other alkyl groups. This treatment can be performed in the gas phase.

BRIEF DESCRIPTION OF THE DRAWINGS

The invention will be explained in more detail below with reference to exemplary embodiments and associated drawings, in which:

FIG. 1 is a block view of an installation for producing an aerogel layer on a substrate. The installation comprises a mixing module 1, a deposition module 2, a gelling module 3, a drying module 4, and a post-treatment module 5. A preferred method for producing the aerogel layer will be described below in which The individual method steps are performed successively in the different modules shown in FIG. 1. In alternative embodiments, a plurality of modules can be combined, ie. a plurality of method steps performed at one location or in one module.

Figure 1:
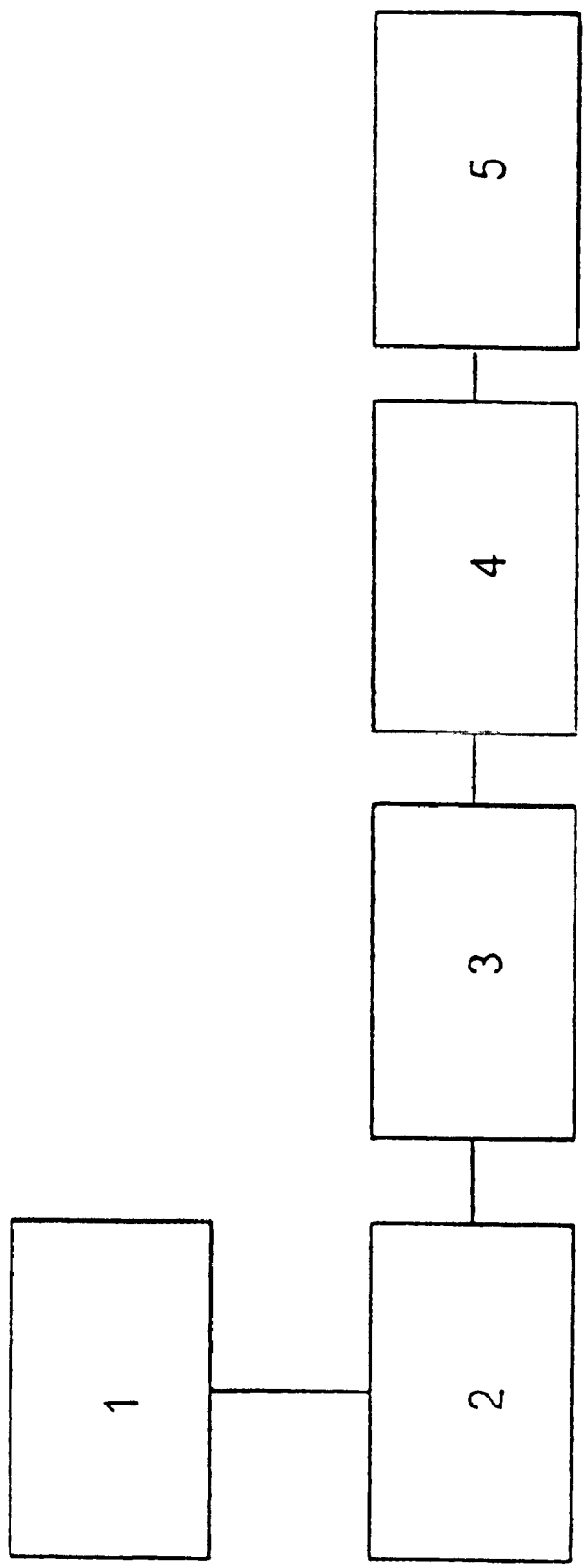
FIG. 1 is a block illustration of an installation for producing the aerogel layer.

A precursor is firstly prepared in the mixing module. Preferably, the three components, tetraethoxysilane, t-butanol (tertiary butanol) and water are firstly mixed. A predetermined amount of the t-butanol, which is present in solid form at room temperature, is measured and heated to liquefaction. The heated liquid t-butanol is subsequently mixed with a predetermined amount of TEOS. A predetermined amount of water is mixed in at the same time or subsequently. About 4 to 30 times the amount (in moles) t-butanol and 4 to 30 times the amount of water can be mixed into one part of TEOS. In order to accelerate the hydrolysis and condensation processes, a catalyst is subsequently added. Since the catalyst is added in aqueous solution, the amount of water that is thereby added, must be taken account of when determining the previously added amount of water. Two types of catalyst are currently preferred. One method represents a two-stage catalysis, in which an ammonium hydroxide solution is firstly added to obtain a pH value of >10 of the mixture, whereby the hydrolysis is accelerated. After a predetermined hydrolysis reaction time, a pH value of <2 is set by addition of a second catalyst in the form of an acid (HCl), whereby the polycondensation is accelerated and proceeds preferentially. In an alternative method, after the mixing of the TEOS with the t-butanol and the water, only one catalyst is added for instance in the form of a 40% hydrofluoric acid (HF) to accelerate hydrolysis and polycondensation. The addition of $HNO_3$ is also possible.

In the two stage catalysis, the following amounts are preferred: 1 Molar part TEOS is mixed with 10 parts t-butanol and 8 parts water 10 vol. % 0.1 N $NH_4$ OH solution is firstly added to this mixture. In the second stage 0.5 vol. % HCl solution is added. After the addition thereof, the ratio of TEOS:water:t-butanol=1:15.3:10. For 100 ml sol, for instance, 15.9 g TEOS is mixed with 56.5 g t-butanol and 11 g water; 10 vol. % (10 ml) of the first catalyst (0.5 N $N_4$ OH) and then 0.5 vol. % (0.5 ml) of the second catalyst (HCl, 32%) are then added. Such a two-stage formulation may also be produced if 21.37 g t-butanol is mixed with 21.37 ml TEOS and 10.37 ml water is added to this mixture. 0.6 ml N $NH_4$ OH and 1.7 ml HCl can then be added.

After the addition of the second catalyst, pre-gelling takes place (eg. over five days at ca. 30° C.). Then the sol-gel substance formed in the pre-gelling process is deposited by means to spinning in the deposition module 2 (FIG. 1) onto a substrate (for instance, a silicon wafer). The substrates, thus coated, move into the gelling module 3, where they remain for five further days, for instance, at temperatures around 30° C., for the gelling and ageing. The substrates with the formed gel layer then move into the drying module which comprises a pressure chamber. The temperature of the gel layer is firstly reduced therein to a temperature which is below the solidification point. The pressure can be maintained at ambient pressure or reduced slightly. After solidification of the gel layer, the pressure in the drying chamber is reduced to below 0.05 bar, whereby a change in phase of the solvent (t-butanol) takes place below the triple point from the solid to the gaseous state. The gaseous t-butanol escapes from the gel layer and is conducted out of the drying chamber. This drying lasts, for instance, one hour.

The substrates with the formed aerogel are than transferred into a post-treatment module 5 where they are tempered, for instance, for 30 minutes to 3 hours, at a temperature of between 200° C. and 800° C. under reduced pressure or in an inert gas atmosphere (eg. nitrogen).

With this two-stage catalysis method and the stated technological parameters, the following layer properties, for instance, were obtained on a silicon wafer:

Relative dielectric constant $\in_r <1.7$

Internal surface area $A_f$ 500 $m^2/g$

Surface roughness—Peak-to-valley height $R_a<8$ nm over an area of (200 $\mu m^2$)

Refractive Index circa ca 1.12 to 1.15

Two alternative embodiments of the method in accordance with the invention use a one-stage catalysis, ie. a single addition of a catalyst. Two exemplary mixtures will be given for this:

EXAMPLE 1: Sol S

| 100 ml sol | TEOS:water:t-butanol 22.8 g:14.8 g:47.9 g |
|---|---|
| + 0.2 vol. % (=0.2 ml) catalyst (HF, 40%) | |
| corresponds to the molar ratios of: | TEOS:water:t-butanol |
| before the addition of the water-containing catalyst: | 1:7.45:5.87 |
| after addition of water-containing catalyst: | 1:7.55:5.87 |

EXAMPLE 2: Sol B

| 100 ml sol | TEOS:water:t-butanol 13.1 g:8.1 g:61.4 g |
|---|---|
| + 1 vol. % = (1 ml) catalyst (HF 40%) | |
| Molar amount ratios: | TEOS:water:t-butanol |
| before addition of the water-containing catalyst: | 1:7.13 |
| after addition of the water-containing catalyst: | 1:5.5:13 |

The process times could be further reduced in the methods with single stage catalysis. After the mixing and addition of the catalyst, pre-gelling of the sol takes place over about 90 minutes at a temperature of, for instance, 32° C. The layer is then deposited on to the substrate by means of spinning. The gelling and ageing lasted about 90 minutes at a temperature of c. 32° C. It is then cooled down to a temperature of about 15° C. After solidification of the gel layer, drying occurs by sublimation of the t-butanol at about 15° C. and a pressure of $\leq 0.05$ bar, which takes a time of about 30 minutes to 1 hour. The gel layer is then post-treated at a temperature of 200° C. to 800° C. at reduced pressure in an inert gas atmosphere. The following properties of a layer applied to a silicon wafer are achieved, for instance, with these technological parameters:

Porosity—66% air and 34% solid material

Chemical composition Si:O:H=1:2:0.28

Pore size <10 nm

Achievable layer thicknesses—200–600 nm

Refractive index <1.2

Figure 2:
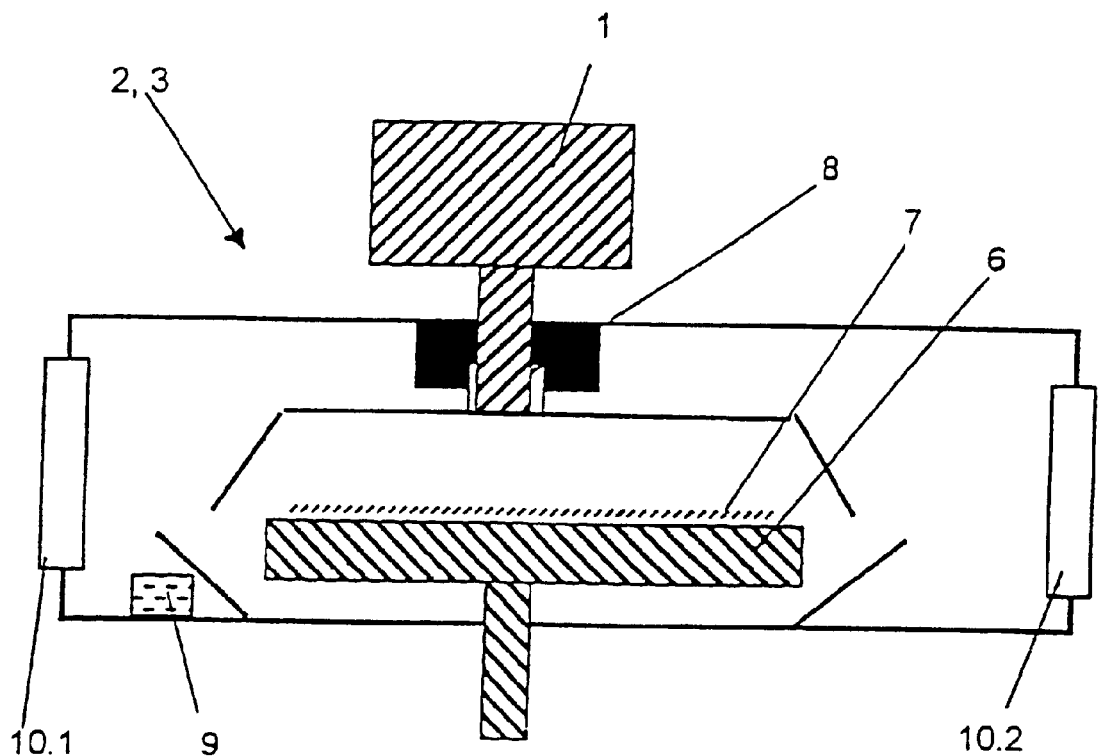
FIG. 2 is a basic illustration of a deposition and gelling module.

In addition to the separate construction of the modules shown in FIG. 1, it is also possible to combine the number of modules, ie. to perform a number of method steps in one process chamber. FIG. 2 shows an arrangement in which the mixing module 1, deposition module 2 and gelling module 3 are combined. The mixing module 1 is located above a process chamber. In the process chamber there is a support table (wafer chuck) 6, onto which a substrate 7 (wafer; silicon disc) is placed. A predetermined amount of the sol-gel mixture is applied to the substrate 7 by means of the mixing device 8. A uniform layer is then produced on the substrate by spinning, ie. by rotation of the support table 6. Situated in the process chamber is a device 9 for evaporating the sol (t-butanol). Gates 10.1 and 10.2 for loading and removing the substrate are provided in the wall of the process chamber.

Figure 3:
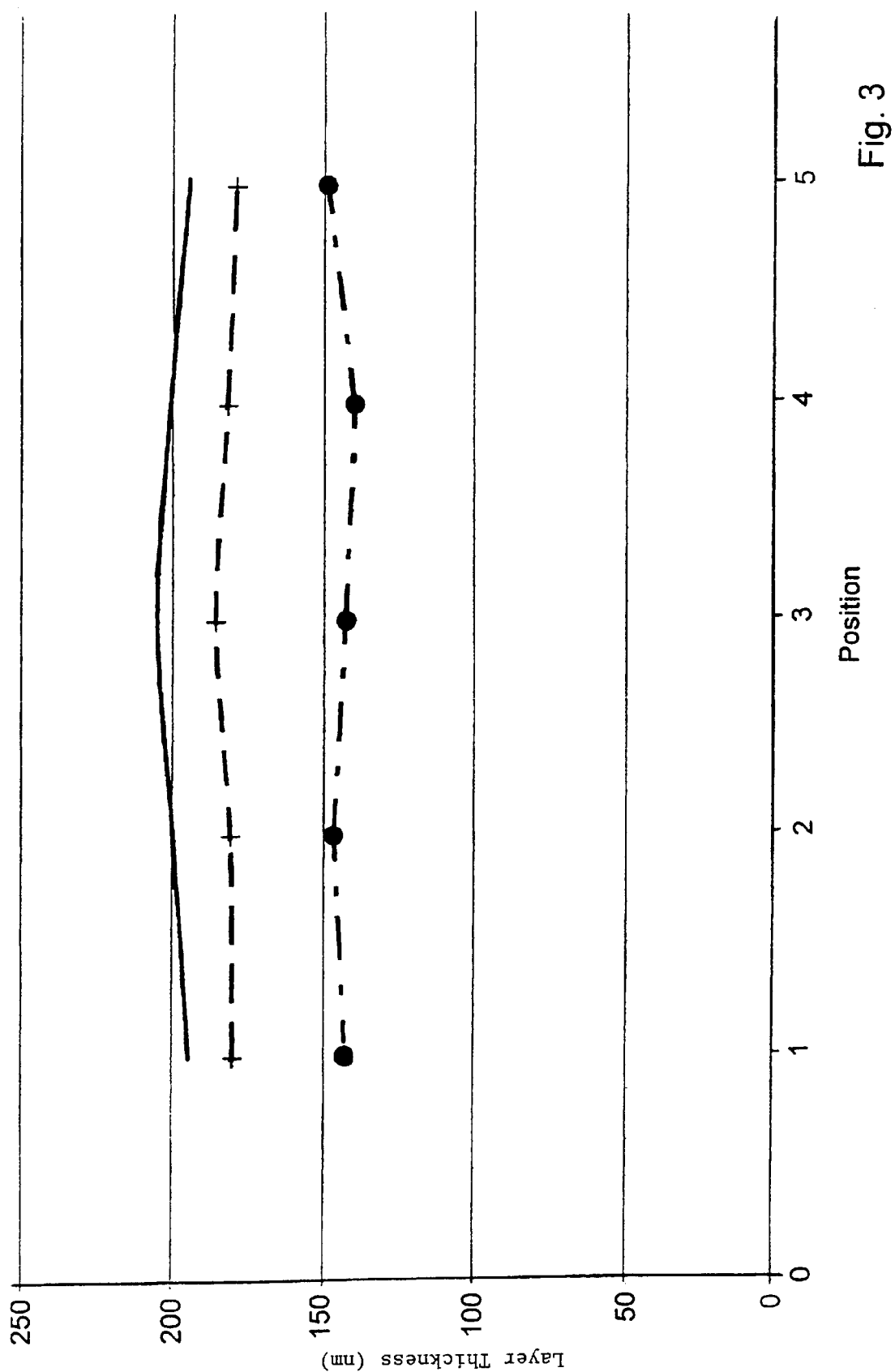
FIG. 3 is a diagram illustrating the aerogel layer thickness distribution on a silicon wafer.

The diagram of FIG. 3 illustrates the layer thicknesses measured on three exemplary aerogel layers on 100 nm silicon wafers, at five positions in each case. TEOS and t-butanol were used to produce the precursor in the illustrated samples. It is apparent from the diagram that the very uniform layer thickness of the aerogel layer may be achieved with the aforementioned method. This permits the use of the method in a process for manufacturing integrated circuit chips which are to be formed in a large number on the substrate. The uniform layer thickness results in small variations between the chips distributed on the substrate. More important, however, is the even smaller variation within the chips so that the elements produced on a chip have the same parameters.

Figure 4:
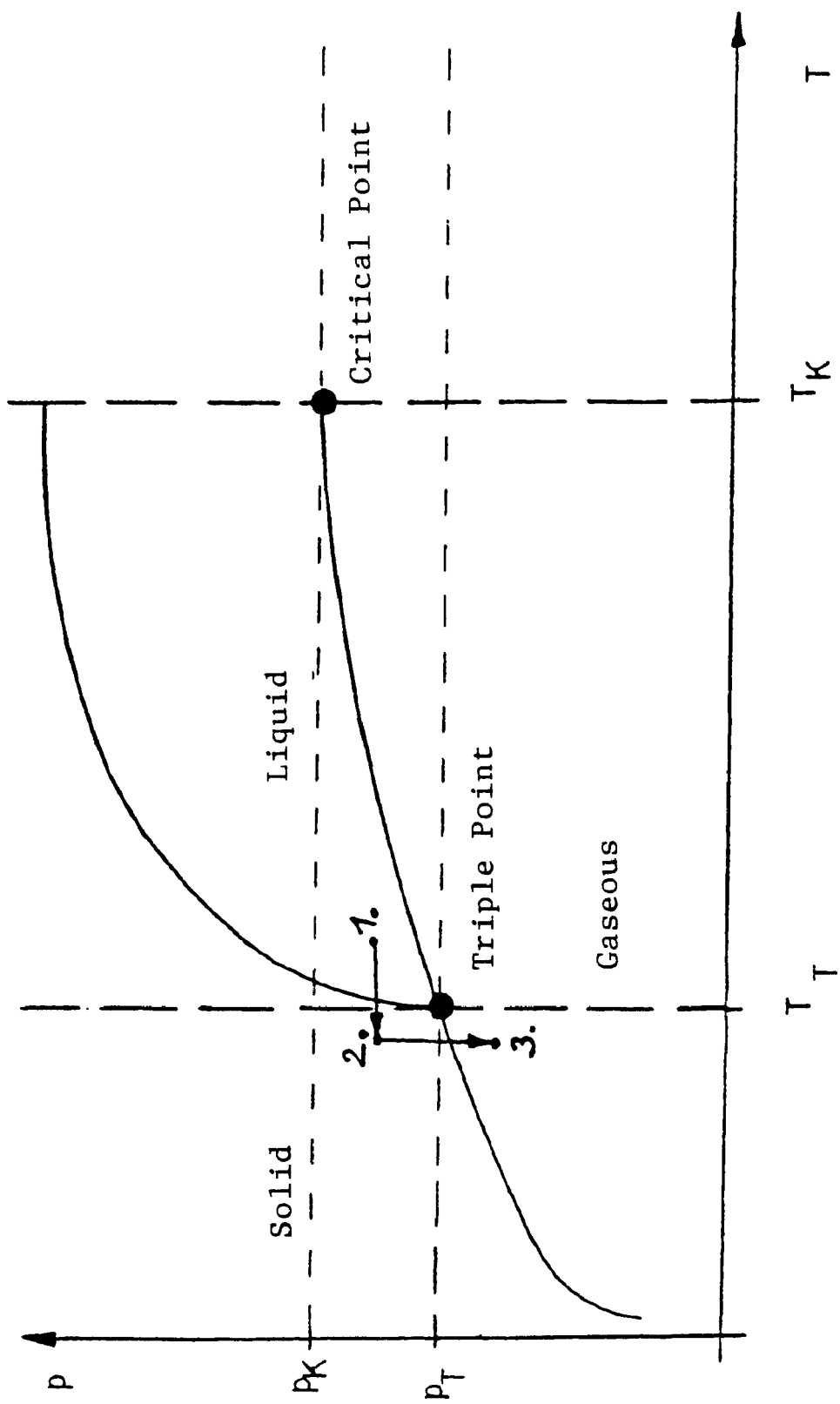
FIG. 4 is a phase diagram of the solvent which is used.

FIG. 4 is a pressure-temperature phase diagram of the solvent which is used, for instance t-butanol. The triple point for t-butanol is at a pressure of $p_t=0.053$ bar and a temperature $\theta_t=24.96°$ C. During mixing and gelling, a liquid state is adopted: the temperature is below the triple point temperature and the pressure is for instance, 1 bar. After the gelling has been completed, the temperature is reduced at the prevailing pressure so that it is about 3–70K, preferably 5–15K, below the solidification point. For instance, the temperature is reduced to about 10–20° C. After solidification of the t-butanol, the pressure is reduced, whereby a point is approached which is situated in the gaseous region of the phase diagram of FIG. 4. The straight line extending from the point, which was previously approached and is situated in the solid region, and the point in the gaseous region intersects the solidification boundary below the triple point so that the solvent sublimes. Depending on the starring point in the solid region, when the pressure is reduced, the temperature can also be slightly increased.

It is possible with the method in accordance with the invention to apply homogenous aerogel layers to substrates. The silicon dioxide aerogel layers produced by using alcoxysilanes particularly TEOS, are suitable as dielectric layers with a very low relative dielectric constant ($\in_r<2$). The dielectric constant of the layer thus comes very close to that of air. The reduction of the dielectric constant can be used for a reduction in parasitic capacitance of metallic conductors extending on or below the aerogel layers. The reduced parasitic capacitance results in reduced signal time delays in high frequency applications and also a reduction in the signal crosstalk of closely adjacent conductive tracks. The aerogel layers thus produced are temperature resistant up to 700° C.

Figure 5:
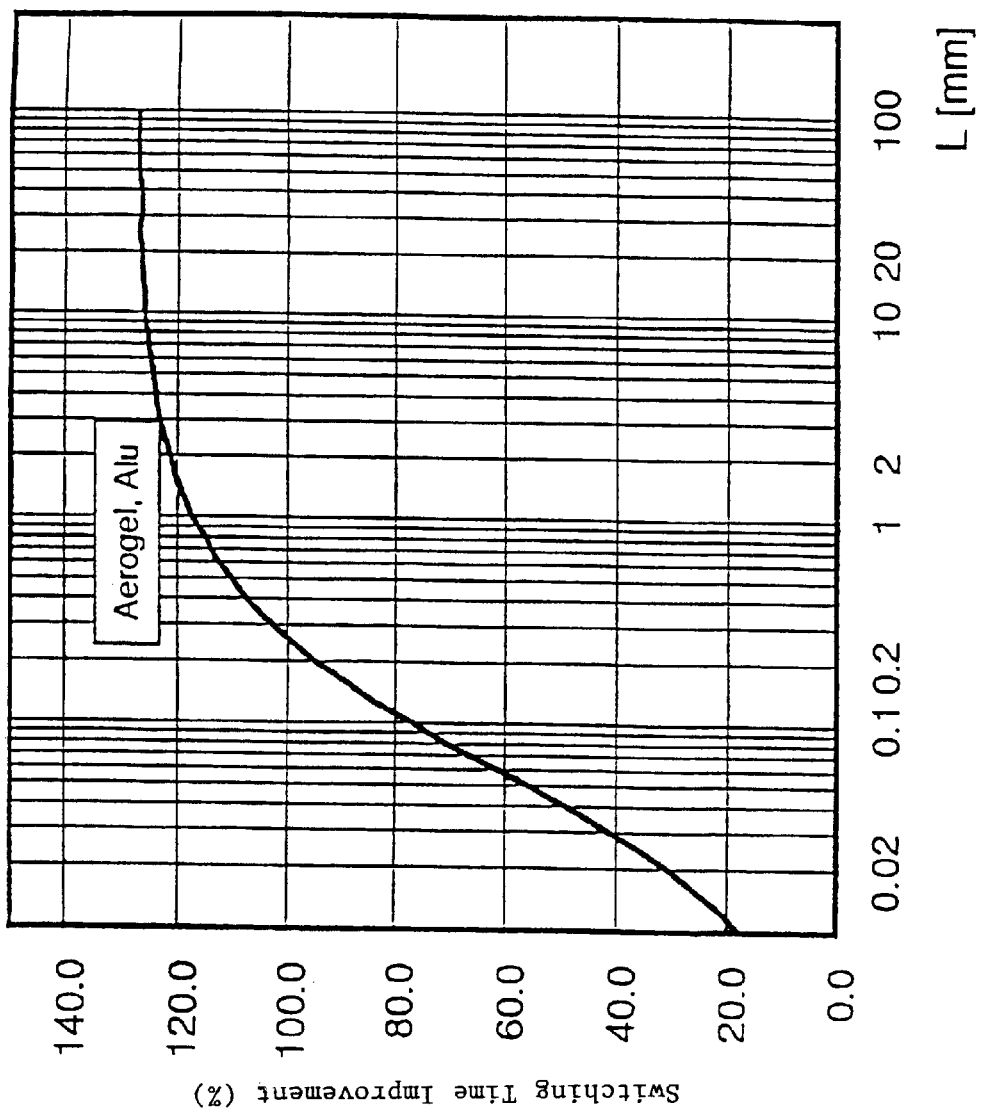
FIG. 5 is a diagram which shows the improvement in the switching time when using an aerogel layer as the dielectric in comparison to an SiO$_2$ layer.

FIG. 5 is a diagram which shows the percentage switching time improvement when using silicon oxide aerogel layers as the dielectric between aluminium coatings of integrated circuits in comparison to conventional silicon dioxide layers. The relative dielectric constant of the aerogel is estimated at 1.7 and that of the silicon dioxide 3.9. The specific resistance of the aluminium is estimated at 3.7 $\mu\Omega$ cm. Further parameters were as follows:

Design values 0.18 $\mu$m (CMOS-Technology)
Driver resistance 50$\Omega$, and
Load capacity 5fF.

As a result of the aforementioned properties of the aerogels, they can also be used, in addition to the aforementioned usages, in the following fields of application in which materials with large internal surface areas are of advantage:

Gas sensors,
Storage of catalysts (e.g. for microreactors),
Thermal insulation,
Background illumination for LCD screens,
Coating of large surfaces for the production of thermally protected glass.

What is claimed is:

1. A method of producing an aerogel layer on a substrate, said method comprising the steps of:
   a) providing a precursor mixture by mixing at least one material selected from the group consisting of: silicates, metal alcoholates, aluminates and borates with a solvent, said precursor mixture for forming a lyosol;
   b) applying the precursor mixture or the lyosol formed therefrom to said substrate, wherein a layer of the lyosol is formed on said substrate;
   c) forming a gel from the lyosol by chemical conversion, a temperature being selected at which the solvent is present in a liquid state;
   d) reducing, at a pressure of between 0.5 and 2 bar, the ambient temperature by about 3–70K below the point at which the solvent is converted into the solid state; and
   e) converting the solvent into the gaseous state in a drying chamber whilst reducing the pressure of the solvent below the triple point and removing the solvent from the gel layer.

2. The method of claim 1, wherein a solvent is used which has a triple point at a temperature above 0° C.

3. The method of claim 2, wherein a solvent is used which has a triple point at a temperature above 15° C.

4. The method of claim 1, wherein the solvent comprises a tertiary alcohol.

5. The method of claim 4, wherein the solvent comprises t-butanol.

6. The method of claim 1, wherein the step of providing the precursor mixture comprises the step of mixing a material, comprising an alcoxysilane, with a tertiary alcohol as a solvent and with water.

7. The method of claim 6, wherein said alcoxysilane comprises tetraethoxysilane (TEOS).

8. The method of claim 7, wherein said tertiary alcohol comprises t-butanol.

9. The method of claim 1, wherein the step of providing the precursor mixture comprises the step of adding water in addition to the solvent.

10. The method of claims 1, wherein the step of providing the precursor mixture comprises the steps of initially mixing a material from the group with the solvent and subsequently adding water, wherein the solvent is liquefied by heating before said mixing.

11. The method of claim 1, wherein the step of providing the precursor mixture comprises the step of adding a catalyst for accelerating the gel formation.

12. The method of claim 11, comprising, before the step of applying the precursor mixture to the substrate, the step of pre-gelling.

13. The method of claims 1, comprising, after step c) and before step d), the step of rinsing the gel layer applied to the substrate with the solvent.

14. The method of claim 13, wherein in the rinsing step, a hydrophobing agent is added which replaces water and OH groups in the gel layer by alkyl groups.

15. The method of claim 1, wherein the step of providing a precursor mixture in step a) comprises the steps of:
  a1) mixing an alcoxysilane with a tertiary alcohol at a temperature at which the mixture is present in liquid form and adding water;
  a2) adding a catalyst which accelerates hydrolysis and/or condensation; and
  a3) storing the mixture at a temperature at which the mixture is present in liquid form and under an atmosphere which is saturated with the low-molecular tertiary alcohol so that pre-gelling takes place.

16. The method of claim 15, said storing step comprising storing the mixture for a period of between 1 hour and a number of days.

17. The method of claim 15, wherein the pre-gelled mixture formed in step a3) is applied in step b) to the substrate by spinning on.

18. The method of claim 15, wherein in step a1) tetraethoxysilane (TEOS) is mixed with more than twice the amount (moles) of t-butanol.

19. The method of claim 18, wherein tetraethoxysilane is mixed with 4–30 times the amount of t-butanol.

20. The method of claim 18, wherein water is added in an amount which corresponds approximately to twice to 30 times the amount of the tetraethoxysilane used in step a1).

21. The method of claim 20, wherein water is added in an amount which corresponds to 4–30 times the amount of the tetraethoxysilane.

22. The method of claim 1, wherein steps a) and b) are performed at pressures between 0.5 and 1 bar.

23. The method of claim 22, wherein t-butanol is used as the solvent and the pressure is reduced to below 0.05 bar in step e).

24. The method of claim 1, wherein after the removal of the solvent from the gel layer in step e):
  f) the aerogel layer applied to the substrate is tempered at a temperature between 200° C. and 800° C. under an inert gas atmosphere or a reduced pressure.

25. The method of claim 24, wherein after the tempering in step f):
  g) the gel layer is treated with a hydrophobia-imparting agent which replaces OH groups by alkyl groups.

* * * * *